United States Patent
Tateoka et al.

(10) Patent No.: US 10,244,635 B2
(45) Date of Patent: Mar. 26, 2019

(54) PRODUCTION METHOD FOR COPPER-CLAD LAMINATE PLATE

(71) Applicant: MITSUI MINING & SMELTING CO., LTD., Tokyo (JP)

(72) Inventors: Ayumu Tateoka, Ageo (JP); Makoto Hosokawa, Ageo (JP); Shota Kawaguchi, Ageo (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 0 days.

(21) Appl. No.: 15/570,846

(22) PCT Filed: Jan. 31, 2017

(86) PCT No.: PCT/JP2017/003344
§ 371 (c)(1),
(2) Date: Oct. 31, 2017

(87) PCT Pub. No.: WO2017/150043
PCT Pub. Date: Sep. 8, 2017

(65) Prior Publication Data
US 2018/0139848 A1 May 17, 2018

(30) Foreign Application Priority Data

Mar. 3, 2016 (JP) .................................. 2016-040795
Nov. 2, 2016 (WO) .................. PCT/JP2016/082658

(51) Int. Cl.
*B29C 65/00* (2006.01)
*H05K 3/02* (2006.01)
*B32B 15/08* (2006.01)
*C23C 22/63* (2006.01)
*B32B 7/12* (2006.01)
*B32B 15/085* (2006.01)
*B32B 27/32* (2006.01)
*B32B 37/14* (2006.01)
*H05K 3/38* (2006.01)
*C23C 22/52* (2006.01)
*B32B 38/00* (2006.01)
*C25D 1/04* (2006.01)
*B32B 15/20* (2006.01)
*C25D 3/38* (2006.01)

(52) U.S. Cl.
CPC ............ *H05K 3/022* (2013.01); *B32B 7/12* (2013.01); *B32B 15/08* (2013.01); *B32B 15/085* (2013.01); *B32B 27/322* (2013.01); *B32B 37/144* (2013.01); *B32B 38/0012* (2013.01); *C23C 22/52* (2013.01); *C23C 22/63* (2013.01); *C25D 1/04* (2013.01); *H05K 3/385* (2013.01); *H05K 3/389* (2013.01); *B29C 66/45* (2013.01); *B29C 66/472* (2013.01); *B29C 66/7352* (2013.01); *B29C 66/7392* (2013.01); *B32B 15/20* (2013.01); *B32B 2255/24* (2013.01); *B32B 2309/105* (2013.01); *B32B 2327/18* (2013.01); *B32B 2398/20* (2013.01); *B32B 2457/08* (2013.01); *C25D 3/38* (2013.01); *H05K 2203/0307* (2013.01)

(58) Field of Classification Search
CPC .................. B29C 66/45; B29C 66/472; B29C 66/64281; B29C 66/7352; B29C 66/7392; B32B 7/12; B32B 15/08; B32B 15/085; B32B 15/20; B32B 27/322; C23C 22/52; C23C 22/63; H05K 3/385; H05K 3/389
USPC .............................................. 156/307.7, 325
See application file for complete search history.

(56) References Cited

U.S. PATENT DOCUMENTS

| 2,955,974 | A | * | 10/1960 | Allen | ...................... B29C 70/00 148/251 |
|---|---|---|---|---|---|
| 4,642,161 | A | * | 2/1987 | Akahoshi | ................ B32B 15/08 216/35 |
| 2003/0201247 | A1 | * | 10/2003 | Morikawa | ................. C23F 1/18 216/33 |
| 2008/0150064 | A1 | * | 6/2008 | Zimmerman | ........... H01L 23/10 257/433 |
| 2009/0294294 | A1 | * | 12/2009 | Feng | ........................ C23F 1/18 205/125 |
| 2010/0233011 | A1 | * | 9/2010 | Nakako | .................. H01B 1/026 419/9 |

FOREIGN PATENT DOCUMENTS

| JP | 06-104543 A | 4/1994 |
|---|---|---|
| JP | 2005-310621 A | 11/2004 |
| JP | 2011-162860 A | 8/2011 |

(Continued)

OTHER PUBLICATIONS

International Search report issued with respect to Application No. PCT/JP2017/003344, dated Apr. 11, 2017.

*Primary Examiner* — Mark A Osele
*Assistant Examiner* — Nickolas R Harm
(74) *Attorney, Agent, or Firm* — Greenblum & Bernstein, P.L.C.

(57) ABSTRACT

There is provided a method of producing a copper clad laminate having a copper foil and a resin bonded at high adhesive force despite the use of a thermoplastic resin having a low dielectric constant. This method includes the steps of: providing a roughened copper foil having at least one roughened surface having fine irregularities composed of acicular crystals containing cupric oxide and cuprous oxide; and bonding a sheet-shaped thermoplastic resin to the roughened surface of the roughened copper foil to provide a copper clad laminate. The roughened surface has a cupric oxide thickness of 1 to 20 nm and a cuprous oxide thickness of 15 to 70 nm, both determined by sequential electrochemical reduction analysis (SERA) at the time of bonding the thermoplastic resin.

8 Claims, No Drawings

(56) References Cited

FOREIGN PATENT DOCUMENTS

| JP | 2015-040324 A | 3/2015 |
| WO | 2014/126193 A1 | 8/2014 |
| WO | 2014/156638 A1 | 10/2014 |
| WO | 2015/040998 A1 | 3/2015 |
| WO | 2015/111756 A1 | 7/2015 |

* cited by examiner

PRODUCTION METHOD FOR COPPER-CLAD LAMINATE PLATE

TECHNICAL FIELD

The present invention relates to a method of producing a copper clad laminate.

BACKGROUND ART

Roughened copper foils have been proposed for printed circuit board suitable to form fine-pitch circuits. Such copper foils have roughened surfaces with fine irregularities formed through oxidation treatment and then reduction treatment (hereinafter sometimes collectively referred to as oxidation-reduction treatment).

For example, Patent Document 1 (WO2014/126193) discloses a surface-treated copper foil which is provided with a roughened layer having acicular fine irregularities composed of a copper complex compound having a maximum length of 500 nm or less. Furthermore, Patent Document 2 (WO2015/040998) discloses a copper foil which has, on at least one side thereof, a roughened layer having fine irregularities, i.e., acicular protrusions having a maximum length of 500 nm or less composed of a copper composite compound and has a silane coupling agent layer on the surface of the roughened layer. These roughened copper foils disclosed in these documents can achieve high adhesion to the insulating resin substrate by the anchor effect due to the fine irregularities of the layer and also enable formation of fine-pitch circuits with high etching factors. Both the roughened layers having fine irregularities disclosed in Patent Documents 1 and 2 are formed through oxidation-reduction treatment after preliminary treatment such as alkaline degreasing. The fine irregularities formed in this way have a unique shape of acicular crystals composed of a copper composite compound. The roughened surfaces having such fine irregularities are generally finer than roughened surfaces formed by the attachment of the fine copper particles and roughened surfaces formed by etching.

CITATION LIST

Patent Documents

Patent Document 1: WO2014/126193
Patent Document 2: WO2015/040998

SUMMARY OF THE INVENTION

In recent years, the sophistication of electronic devices, such as portable electronic devices, requires high frequency signals for high-speed processing of large amounts of information, and thus printed circuit boards suitable for high frequency applications. Such a high frequency printed circuit board requires a reduction in transmission loss to ensure transmission of high frequency signals without deterioration of their quality. The printed circuit board is provided with a trace pattern of a copper foil and an insulating resin substrate, and the transmission loss consists mainly of the conductor loss caused by the copper foil and the dielectric loss caused by the insulating resin substrate. Accordingly, it would be desirable that a thermoplastic resin having a low dielectric constant could be used to reduce the dielectric loss of the insulating resin substrate. However, a thermoplastic resin having a low dielectric constant such as a fluororesin (e.g., polytetrafluoroethylene (PTFE)) or a liquid crystal polymer (LCP) resin has a low chemical activity unlike a thermosetting resin, and thus has low adhesion to copper foil. In order to produce a copper clad laminate with a thermoplastic resin and a copper foil, the surface of the copper foil to be bonded to the thermoplastic resin is roughened to a certain level of surface roughness, thereby improving the adhesion to the resin. Since a reduction in conductor loss, however, requires a copper foil having a smooth surface, a technique is desired for improving the adhesion between a copper foil having a low roughness and a thermoplastic resin.

The present inventors have found that, in a roughened copper foil having a roughened surface having fine irregularities composed of acicular crystals, control of these amounts of cupric oxide and cuprous oxide in terms of thickness determined by serial chemical reduction analysis (SERA) within a predetermined range achieves high adhesion to a thermoplastic resin having a low dielectric constant. As a result, it was found that copper clad laminate composed of a copper foil and a thermoplastic resin bonded to each other with high adhesive force can be produced even though the thermoplastic resin has a low dielectric constant.

Accordingly, an object of the present invention is to produce a copper clad laminate composed of a copper foil and a thermoplastic resin bonded to each other with high adhesive force even though the thermoplastic resin has a low dielectric constant.

According to one embodiment of the present invention, there is provided a method of producing a copper clad laminate, including the steps of:

providing a roughened copper foil having at least one roughened surface having fine irregularities composed of acicular crystals containing cupric oxide and cuprous oxide;

bonding a sheet-shaped thermoplastic resin to the roughened surface of the roughened copper foil to provide a copper clad laminate, wherein the roughened surface has a cupric oxide thickness of 1 to 20 nm and a cuprous oxide thickness of 15 to 70 nm, both determined by sequential electrochemical reduction analysis (SERA) at the time of bonding the thermoplastic resin.

DESCRIPTION OF EMBODIMENT

Method of Producing Copper Clad Laminate

The present invention relates to a method of producing a copper clad laminate. The method of the present invention includes (1) a step of providing a roughened copper foil and (2) a step of bonding a sheet-shaped thermoplastic resin to the roughened surface of the roughened copper foil. The roughened copper foil has a roughened surface having fine irregularities composed of acicular crystals containing cupric oxide (CuO) and cuprous oxide ($Cu_2O$) on at least one side. The roughened surface has a cupric oxide thickness of 1 to 20 nm and a cuprous oxide thickness of 15 to 70 nm, both determined by sequential electrochemical reduction analysis (SERA) at the time of bonding the thermoplastic resin. In this way, in the roughened copper foil having the roughened surface having the fine irregularities composed of acicular crystals, control of these amounts of cupric oxide and cuprous oxide in terms of thickness determined by the sequential electrochemical reduction analysis (SERA) within the above respective predetermined ranges achieves high adhesion to the thermoplastic resin having the low dielectric constant. That is, as described above, the thermoplastic resin having a low dielectric constant such as a fluororesin (e.g., polytetrafluoroethylene (PTFE)) or a liquid crystal polymer (LCP) resin, unlike the thermosetting resin, has a low chemical activity, thus, inherently has low adhesion to the copper foil. This is probably due to the poor affinity between the hydrophilic surface of fine irregularities and the hydrophobic thermoplastic resin. That is, the surface with fine irregularities composed of acicular crystals containing cupric oxide and cuprous oxide tends to exhibit hydrophilicity due to the presence of OH groups, whereas the thermoplastic resin is hydrophobic. In this regard, according to the method of the present invention, the amounts of cupric oxide and cuprous oxide in terms of thickness determined by SERA are controlled within the above predetermined ranges to make a roughened surface in a specific oxidation state to which the thermoplastic resin is bonded. Thus, the affinity between the roughened surface of the roughened copper foil and the thermoplastic resin can be increased, so that high adhesion, that is, high peel strength can be achieved. Consequently, a copper clad laminate having a copper foil and a resin bonded at high adhesive force can be produced despite the use of a thermoplastic resin having a low dielectric constant.

(1) Provision of Roughened Copper Foil

The copper foil used in the method of the present invention is a roughened copper foil. This roughened copper foil has a roughened surface on at least one side. The roughened surface has fine irregularities composed of acicular crystals containing cupric oxide and cuprous oxide. The roughened surface has a cupric oxide thickness of 1 to 20 nm, preferably 1 to 18 nm, more preferably 2 to 15 nm, and a cuprous oxide thickness of 15 to 70 nm, preferably 20 to 65 nm, more preferably 25 to 40 nm, determined by sequential electrochemical reduction analysis (SERA) at the time of bonding the thermoplastic resin. This SERA analysis can be carried out, for example, by the following procedure with a commercially available SERA analyzer (e.g., QC-100 manufactured by ECI Technology, Inc.). For analysis, a region of 8.0 mm$^2$ of the roughened copper foil is isolated with an O-ring gasket, where a borate buffer solution is injected and saturated with nitrogen. A current density $I_d$ of 30 μA/cm$^2$ is applied to the above region, and the times $t_1$ and $t_2$ (sec) taken for the $Cu_2O$ reduction reaction appearing at −0.40 V to −0.60 V and CuO reduction reaction appearing at −0.60 V to −0.85 V, respectively, are measured. Each thickness T (nm) of the CuO and $Cu_2O$ layers is calculated based on the equation $T=K \cdot I_d \cdot t$ using the constant K obtained from Faraday's law. The constant K is $6.53 \times 10^{-5}$ (cm$^3$/A·sec) for CuO or is $2.45 \times 10^{-4}$ (cm$^3$/A·sec) for $Cu_2O$.

The fine irregularities can be formed through oxidation-reduction treatment and is typically observed in such a shape (for example, grassy shape) that acicular crystals are grown substantially perpendicularly and/or obliquely to the copper foil surface. The height of the acicular crystal (that is, the height measured in the vertical direction from the root of the acicular crystal) is preferably 50 to 400 nm, more preferably 100 to 400 nm, still more preferably 120 to 350 nm. The height of the acicular crystal within the above range is more suitable for formation of fine-pitch circuits and high frequency applications. In particular, the low roughness described above can reduce the skin effect of the copper foil, which is a problem in high frequency signal transmission, leading to a reduction in conductor loss caused by the copper foil, resulting in a significant reduction in transmission loss of the high frequency signals.

The roughened copper foil of the present invention may have any thickness, but has preferably a thickness of 0.1 to 70 μm, more preferably 0.5 to 18 μm. It should be noted that the roughened copper foil of the present invention may be not only an ordinary roughened copper foil but also a roughened copper foil with a carrier.

According to a preferred embodiment of the present invention, the roughened copper foil has an organic rust-proof layer on the roughened surface. The organic rust-proof layer preferably contains, but should not be limited to, a triazole compound and/or a silane coupling agent. Examples of the triazole compounds include benzotriazole, carboxybenzotriazole, methylbenzotriazole, aminotriazole, nitrobenzotriazole, hydroxybenzotriazole, chlorobenzotriazole, ethylbenzotriazole, naphthotriazole. Examples of the silane coupling agent include epoxy functional silane coupling agents, such as 3-glycidoxypropyltrimethoxysilane and 3-glycidoxypropylmethyldimethoxysilane; amino functional silane coupling agents, such as 3-aminopropyltriethoxysilane, 3-aminopropyltrimethoxysilane, N-2 (aminoethyl) 3-aminopropyltrimethoxysilane, and N-phenyl-3-aminopropyltrimethoxysilan; mercapto functional silane coupling agents, such as 3-mercaptopropyltrimethoxysilane; vinyl functional silane coupling agents, such as vinyltrimethoxysilane and vinylphenyltrimethoxysilane; methacryl functional silane coupling agents, such as 3-methacryloxypropyltrimethoxysilane; acrylic functional silane coupling agents, such as 3-acryloxypropyltrimethoxysilane; imidazole functional silane coupling agents, such as imidazole silane; and triazine functional silane coupling agents, such as triazine silane. More preferably, the organic rust-proof layer contains a triazole compound, and preferred examples of the triazole compound include benzotriazole (BTA) and carboxybenzotriazole (CBTA). An organic rust-proof layer containing a triazole compound such as BTA or CBTA is particularly preferable when the thermoplastic resin is a fluororesin. The reasons why the triazole compound is more preferable are as follows. The triazole compound can form copper complex with cuprous oxide on the roughened surface to adhere on the surface more densely than on the surface of a regular copper foil, so that it can exert an excellent rust-proof function. Thus, the thicknesses of the cupric oxide and the cuprous oxide during the long-term storage of the roughened copper foil can be maintained within the above-mentioned predetermined ranges. Furthermore, in harsh environments such as high temperatures, the organic rust-proof layer containing the triazole compound can maintain fine irregularities on the surface and thus can maintain high reliability.

(2) Bonding of Thermoplastic Resin

A sheet-shaped thermoplastic resin is bonded to the roughened surface of the roughened copper foil to provide a copper clad laminate. The thermoplastic resin may be bonded to the roughened copper foil in accordance with any known process for producing a copper clad laminate. Another applicable technique is bonding of a copper foil to an inner layer substrate via a thermoplastic resin. In this case, the bonding may be performed by any known technique, such as a so-called build-up process. In any case, according to the method of the present invention, the amounts of cupric oxide and cuprous oxide in terms of thickness determined by SERA are controlled within the predetermined ranges to form a roughened surface in a specific oxidation state, and the thermoplastic resin is bonded onto the roughened surface. The affinity between the roughened surface of the roughened copper foil and the thermoplastic resin can thereby be enhanced, resulting in high adhesion or high peel strength. Consequently, a copper clad laminate having a copper foil and a resin bonded at high adhesive force can be produced despite the use of a thermoplastic resin having a low dielectric constant. It is preferred that the thermoplastic resin be bonded to the roughened copper foil by thermal pressure, and thereby the thermoplastic resin can be softened to adapt to the fine irregularities on the roughened surface. As a result, the adhesion between the copper foil and the resin can be ensured by the anchor effect due to the bite of fine irregularities (especially acicular crystals) into the resin. Any pressurizing temperature may be selected depending on the properties of the thermoplastic resin to be used. The temperature is preferably 150 to 500° C., more preferably 180 to 400° C. The bonding may be carried out under any pressure. The pressure is preferably 1 to 10 MPa, more preferably 2 to 5 MPa.

The sheet-shaped thermoplastic resin may be a cut sheet piece or a long sheet released from a roll, and may have any form. Preferred examples of the thermoplastic resin include polysulfones (PSFs), polyethersulfones (PESs), amorphous polyarylates (PARs), liquid crystal polymers (LCPs), polyether ether ketones (PEEKs), thermoplastic polyimides (PIs), polyamide-imides (PAIs), fluororesin, polyamides (PAs), nylon, polyacetals (POMs), modified polyphenylene ether (m-PPEs), polyethylene terephthalate (PET), glass fiber reinforced polyethylene terephthalate (GF-PET), cycloolefins (COPs), and any combination thereof. From the viewpoints of desirable dielectric loss tangent and high heat resistance, more preferred examples of the thermoplastic resin include polysulfones (PSFs), polyethersulfones (PESs), amorphous polyarylates (PARs), liquid crystal polymers (LCPs), polyether ether ketones (PEEKs), thermoplastic polyimides (PIs), polyamide-imides (PAIs), fluororesins, and any combination thereof. From the viewpoint of low dielectric constant, a particularly preferred thermoplastic resin is a fluororesin. Preferred examples of the fluororesin include polytetrafluoroethylene (PTFE), tetrafluoroethylene-perfluoroalkylvinylether copolymers (PFAs), tetrafluoroethylene-hexafluoropropylene copolymers (FEPs), tetrafluoroethylene-ethylene copolymers (ETFEs), and any combinations thereof.

The roughened copper foil may be provided on one side or two sides of a sheet-shaped thermoplastic resin. The sheet-shaped thermoplastic resin may be composed of a thermoplastic resin, and may further contain other materials. The sheet-shaped thermoplastic resin may be a prepreg. The prepreg is a generic term for a composite material prepared by impregnating a substrate, such as a synthetic resin plate, glass plate, glass woven fabric, glass nonwoven fabric, or paper, with a synthetic resin. The thermoplastic resin may further contain filler particles composed of various inorganic particles, such as silica and alumina, from the various viewpoints such as improving the insulating characteristics. The sheet-shaped thermoplastic rein has any thickness. The thickness is preferably 1 to 1000 µm, more preferably 2 to 400 µm, and still more preferably 3 to 200 µm. The resin layer may be composed of two or more layers.

Production of Copper Foil

The roughened copper foil according to the present invention may be produced by any process, and is preferably produced through oxidation-reduction treatment. An exemplary preferred process of producing the roughened copper foil according to the present invention will be described below. This preferred process includes a step of providing a copper foil and a roughening step (oxidation-reduction treatment) of sequentially performing preliminary treatment and an oxidation and a reduction treatment on the surface.

(1) Preparation of Copper Foil

The copper foil used for producing the roughened copper foil includes both an electrodeposited copper foil and a rolled copper foil, more preferably an electrodeposited copper foil. The copper foil may be either unroughened or preliminarily roughened. The copper foil has any thickness, but preferably a thickness of 0.1 to 70 µm, and more preferably 0.5 to 18 µm. The copper foil prepared in the form of a copper foil with a carrier can be formed by wet film forming (e.g., electroless copper plating and electrolytic copper plating), dry film forming (e.g., sputtering and chemical vapor deposition) or a combination thereof.

The surface of the copper foil to be roughened preferably has a maximum height Sz (measured according to ISO 25178) of 1.5 µm or less, more preferably 1.2 µm or less, still more preferably 1.0 µm or less. This range readily form a surface profile required for the roughened copper foil of the present invention, especially a maximum height Sz of 1.5 µm or less on the roughened surface. The lower limit of the height Sz is not defined. The height Sz is preferably 0.1 µm or more, more preferably 0.2 µm or more, further preferably 0.3 µm or more.

(2) Roughening Treatment (Oxidation-Reduction Treatment)

It is preferred that the surface of the copper foil with the above-mentioned low Sz be subjected to a wet roughening step of sequentially performing preliminary treatment and an oxidation and a reduction treatment. In particular, the surface of the copper foil is oxidized to form a copper compound containing cupric oxide by a wet process with a solution. The copper compound is then reduced to convert a part of the cupric oxide into cuprous oxide, thereby forming fine irregularities composed of acicular crystals composed of a copper composite compound containing cupric oxide and cuprous oxide on the surface of the copper foil. Thus, fine irregularities are formed by a copper compound containing cupric oxide as a main component at the stage of oxidizing the surface of the copper foil by a wet process. When the copper compound is reduced, a part of the cupric oxide is converted into cuprous oxide while substantially maintaining the shape of the fine irregularities formed by the copper compound, resulting in the fine irregularities composed of copper composite compounds containing cupric oxide and cuprous oxide. In this way, the surface of the copper foil is subjected to a proper oxidation treatment by a wet process and then subjected to a reduction treatment, and thereby fine irregularities of the nm order can be formed.

(2a) Preliminary Treatment

Prior to the oxidation treatment, it is preferred to subject the electrodeposited copper foil to preliminary treatment, such as degreasing, where the electrodeposited copper foil is preferably immersed in an aqueous sodium hydroxide solution to perform alkaline degreasing, followed by rinsing with water. Furthermore, the electrodeposited copper foil subjected to alkaline degreasing treatment is preferably immersed in an aqueous sulfuric acid solution and then rinsed with water. The aqueous sulfuric acid solution may contain any amount of sulfuric acid. The preferred content ranges from 1 to 20 mass %. The immersion time of the electrodeposited copper foil in the aqueous sulfuric acid solution is not critical. The preferred immersion time ranges from 2 sec to 2 min.

(2b) Oxidation Treatment

The preliminarily treated copper foil is oxidized in an alkaline solution, such as sodium hydroxide solution. Oxidation of the surface of the copper foil with an alkaline solution can form fine irregularities composed of acicular crystals composed of a copper composite compound containing mainly cupric oxide on the surface of the copper foil. The alkaline solution has a temperature of preferably from 60 to 85° C. and a pH of preferably from 10 to 14. To facilitate oxidation, the alkaline solution preferably contains chlorate, chlorite, hypochlorite, and/or perchlorate in a total content of preferably 100 to 500 g/L. The oxidation treatment is preferably carried out by immersion the electrodeposited copper foil in an alkaline solution, and the immersion time (that is, the oxidation time) is preferably 10 sec to 20 min, more preferably 30 sec to 10 min.

The alkaline solution used for the oxidation treatment preferably further contains an oxidation inhibitor. Specifically, oxidation treatment on the surface of the copper foil with an alkaline solution may cause the protrusions to excessively grow beyond the desired length, precluding formation of desired fine irregularities. Accordingly, it is preferred to use an alkaline solution containing an oxidation inhibitor capable of moderating oxidation on the copper foil surface from the viewpoint of formation of the fine irregularities. Examples of the preferred oxidation inhibitor include amino functional silane coupling agents. Oxidation of the surface of the copper foil with an alkaline solution containing an amino functional silane coupling agent allows the silane coupling agent in the alkaline solution to be adsorbed on the surface of the copper foil, leading to the inhibition of oxidation of the copper foil surface by the alkaline solution, resulting in suppression of the overgrowth of acicular crystals of cupric oxide to form a desired roughened surface having significantly fine irregularities. Specific examples of the amino functional silane coupling agent include N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, 3-triethoxysilyl-N-(1,3-dimethyl-butylidene)propylamine, and N-phenyl-3-aminopropyltrimethoxysilane, and particularly preferably is N-2-(aminoethyl)-3-aminopropyltrimethoxysilane. Any of them can be dissolved in an alkaline solution, are stably held in an alkaline solution, and exhibit the effect of suppressing oxidation of the copper foil surface described above. A preferred content of the amino functional silane coupling agent (for example, N-2-(aminoethyl)-3-aminopropyltrimethoxysilane) in the alkaline solution is 0.01 to 20 g/L, more preferably 0.02 to 20 g/L.

(2c) Reduction Treatment

The oxidation treated copper foil is subjected to reduction treatment with a reduction solution. Partial conversion of the cupric oxide to cuprous oxide by reduction treatment can form fine irregularities composed of acicular crystals composed of a copper composite compound containing cupric oxide and cuprous oxide on the surface of the copper foil. This reduction treatment may be carried out by bringing the reduction solution into contact with the oxidation treated copper foil by any technique, for example, immersing the oxidation treated copper foil in the reduction solution or showering the reduction solution to the oxidation treated copper foil. The treatment time is preferably 2 to 60 sec, more preferably 5 to 30 sec. A preferred reduction solution is an aqueous dimethylamine borane solution that preferably contains dimethylamine borane at a content of 10 to 40 g/L. It is preferred that the dimethylamine borane aqueous solution be adjusted to pH 12 to 14 with sodium carbonate and sodium hydroxide. The temperature of the aqueous solution at this time may be room temperature although any other temperature is also available. The copper foil after the reduction treatment is preferably rinsed with water and dried.

(3) Rust-Proof Treatment

If desired, the copper foil may be subjected to a rust-proofing treatment with an organic rust-proofing agent to form an organic rust-proof layer. The organic rust-proof layer allows the amounts of cupric oxide and cuprous oxide (determined by SERA in terms of thickness) on the roughened surface of the roughened copper foil to maintain the specific oxidation state in which the amounts of cupric oxide and cuprous oxide are respectively controlled within predetermined ranges as long as possible. Such maintained oxidation state facilitates bonding of the thermoplastic resin to the roughened surface. Other properties such as moisture resistance, chemical resistance, and adhesion to adhesives can also be improved. The organic rust-proof layer preferably contains, but should not be limited to, a triazole compound and/or a silane coupling agent. Examples of the triazole compound include benzotriazole, carboxybenzotriazole, methylbenzotriazole, aminotriazole, nitrobenzotriazole, hydroxybenzotriazole, chlorobenzotriazole, ethylbenzotriazole, and naphthotriazole. Benzotriazole is particularly preferred. Examples of the silane coupling agent include epoxy functional silane coupling agents, such as 3-glycidoxypropyltrimethoxysilane and 3-glycidoxypropylmethyldimethoxysilane; amino functional silane coupling agents, such as 3-aminopropyltriethoxysilane, 3-aminopropyltrimethoxysilane, N-2-(aminoethyl)-3-aminopropyltrimethoxysilane, and N-phenyl-3-aminopropyltrimethoxysilane; mercapto functional silane coupling agents such as 3-mercaptopropyltrimethoxysilane; vinyl functional silane coupling agents, such as vinyltrimethoxysilane and vinylphenyltrimethoxysilane; methacrylic functional silane coupling agents, such as 3-methacryloxypropyltrimethoxysilane; acrylic functional silane coupling agent such as 3-acryloxypropyltrimethoxysilane; imidazole functional silane coupling agents, such as imidazole silane; and triazine functional silane coupling agents, such as triazine silane. The organic rust-proof layer can be formed such that solution of an organic rust-proofing agent, such as a triazole compound or a silane coupling agent, is appropriately diluted, applied, and then dried.

Printed Circuit Board

The copper clad laminate of the present invention is preferably used for production of a printed wiring board. That is, a preferred embodiment of the present invention provides a printed circuit board comprising the copper clad laminate. Specific examples of the printed circuit board include single-sided or double-sided printed circuit boards prepared by forming circuits on the copper clad laminates and a multilayer printed circuit board composed of these printed circuit boards. The multilayer printed circuit board may be formed such that a circuit is formed on a multilayer copper clad laminate (in which a copper foil is attached to an inner layer substrate provided with a thermoplastic resin layer therebetween) or on a multilayer copper clad laminate provided with a buildup layer. A technique such as a modified semi-additive process (MSAP) or a subtractive process may be used for formation of a circuit. The printed circuit board produced with the copper clad laminate of the present invention is suitably used as a radiofrequency substrate in applications, such as automobile antennas, mobile phone base station antennas, high-performance servers, and collision prevention radars used in the radiofrequency band with a signal frequency of 10 GHz or more.

EXAMPLES

The present invention will be described in more detail by the following examples.

Examples 1 to 8

(1) Preparation of Roughened Copper Foil
(1a) Preparation of Electrodeposited Copper Foil A sulfuric acid copper sulfate solution having a composition shown below (a copper electrolytic solution) was electrolyzed with a titanium rotating cathode and dimensionally stable anode (DSA) at 45° C. and a current density of 55 A/dm$^2$ into an electrodeposited copper foil having a thickness of 18 μm. The maximum height Sz of each of the deposited surface and the electrode surface of the electrodeposited copper foil was measured with a laser microscope (VK-X 100, manufactured by Keyence Corporation) in accordance with ISO 25178. As a result, the Sz of the deposited surface was 0.8 μm, and the Sz of the electrode surface was 1.2 μm.

<Composition of Sulfuric Acid Copper Sulfate Solution>
Copper content: 80 g/L
Sulfuric acid content: 260 g/L
Bis-(3-sulfopropyl) disulfide content: 30 mg/L
Diallyldimethylammonium chloride polymer content: 50 mg/L
Chlorine content: 40 mg/L (1b) Roughening Treatment (Oxidation-Reduction Treatment)

The deposited surface of the resulting electrodeposited copper foil was subjected to a roughening treatment (oxidation-reduction treatment) in a three-step process: a preliminary treatment, an oxidation treatment, and a reduction treatment shown below carried out in this order.

<Preliminary Treatment>

The electrodeposited copper foil prepared in Procedure (1) was immersed in 40 g/L aqueous sodium hydroxide solution at 40° C. for 30 sec, subjected to alkaline degreasing, and then rinsed with water. The electrodeposited copper foil subjected to the alkaline degreasing was immersed in an aqueous sulfuric acid solution (sulfuric acid content of 10% by volume) at 40° C. for 30 sec, and then rinsed with water.

<Oxidation Treatment>

The electrodeposited copper foil after the preliminary treatments was oxidation-treated. This oxidation treatment involved immersing the electrodeposited copper foil in a sodium hydroxide solution (liquid temperature: 75° C., pH: 12, chlorite content: 100 to 500 g/L, and N-2-(aminoethyl)-3-aminopropyltrimethoxysilane content: 10 g/L) for 3 min (EXAMPLE 1 to 6 and 8) or 7 min (EXAMPLE 7). Fine irregularities composed of acicular crystals composed of a copper composite compound were thereby formed on the two surfaces of the electrodeposited copper foil.

<Reduction Treatment>

The oxidation-treated sample was then reduction-treated. This reduction treatment involved immersing the sample having fine irregularities formed by the oxidation treatment in an aqueous solution (pH: adjusted to 13 with sodium carbonate and sodium hydroxide, temperature: room temperature, dimethylamine borane content: 10 to 40 g/L) for 1 min. The sample after the reduction treatment was rinsed with water and dried. Through these steps, cupric oxide on the two sides of the electrodeposited copper foil was partially reduced to cuprous oxide to form the roughened surface having fine irregularities composed of a copper composite compound containing cupric oxide and cuprous oxide. The resulting roughened copper foil had at least one roughened surface having fine irregularities composed of acicular crystals.

(1c) Formation of Organic Rust-Proof Layer

An organic rust-proof layer was formed on the roughened copper foil. The organic rust-proof layer was formed as follows: the roughened copper foil was immersed in an aqueous solution containing benzotriazole (Examples 1, 6 and 7), 3-aminopropyltrimethoxysilane (Examples 2 to 5) or carboxybenzotriazole (Example 8) as an organic rust-proofing agent at a concentration of 6 g/L at a liquid temperature of 25° C. for 30 sec, and then dried under the conditions shown in Table 1.

TABLE 1

|  | Organic rust-proof layer | | | Drying | |
|---|---|---|---|---|---|
| Rust-proofing agent | | Content (g/L) | Time (sec) | Temp. (° C.) | Time (sec) | Temp. (° C.) |
| Ex. 1 | Benzotriazole (BTA) | 6 | 30 | 25 | 60 | 130 |
| Ex. 2 | 3-Aminopropyl-trimethoxysilane | 6 | 30 | 25 | 60 | 130 |
| Ex. 3 | 3-Aminopropyl-trimethoxysilane | 6 | 30 | 25 | 20 | 140 |
| Ex. 4 | 3-Aminopropyl-trimethoxysilane | 6 | 30 | 25 | 10 | 150 |
| Ex. 5* | 3-Aminopropyl-trimethoxysilane | 6 | 30 | 25 | 20 | 150 |
| Ex. 6 | Benzotriazole (BTA) | 1 | 30 | 25 | 60 | 140 |
| Ex. 7 | Benzotriazole (BTA) | 1 | 30 | 25 | 60 | 140 |
| Ex. 8 | Carboxybenzotriazole (CBTA) | 1 | 30 | 25 | 60 | 140 |

*indicates a comparative example.

(2) Evaluation of Roughened Copper Foil

The resulting roughened copper foils prepared in EXAMPLE 1 to 5 were subjected to the following evaluations.

<SERA>

The thickness of the cupric oxide (CuO) layer and the thickness of the cuprous oxide (Cu$_2$O) layer were measured by a sequential electrochemical reduction analysis (SERA) on the roughened surface of the roughened copper foil. For this SERA analysis, a QC-100 tester manufactured by ECI Technology, Inc. was used as a measuring device. The procedure was as follows. For analysis, a region of 8.0 mm$^2$ of the roughened copper foil was isolated with an O-ring gasket, where a borate buffer solution was injected and saturated with nitrogen. A current at a density Id of 30 μA/cm$^2$ was applied to the above region, and the times $t_1$ and $t_2$ (sec) taken for the Cu$_2$O reduction reaction appearing at −0.40 V to −0.60 V and CuO reduction reaction appearing at −0.60 V to −0.85 V, respectively, were measured. Each thickness T (nm) of the CuO and Cu$_2$O layers was calculated based on the equation T 32 K·I$_d$·t using a constant K obtained from Faraday's law. The constant K was 6.53×10$^{-5}$ (cm$^3$/A·sec) for CuO or was 2.45×10$^{-4}$ (cm$^3$/A·sec) for Cu$_2$O. The constant K was calculated based on the equation K =M/(z·F·ρ) (where M was the molecular weight, z was the number of charges, F was the Faraday constant, and ρ was the density).

In detail, the constant K (=6.53×10$^{-5}$ (cm$^3$/A·sec)) related to CuO was calculated by inputting the following value into the equation K =M/(z·F·ρ).

M (molecular weight)=79.545 (g/mol)
z (number of charges)=2 (CuO+H$_2$O+2e$^-$→Cu+2OH$^-$)
F (Faraday constant)=96494 (C/mol)=96500 (A·sec/mol)
ρ(density)=6.31 (g/cm$^3$)

The constant K (=2.45×10$^{-4}$ (cm$^3$/A·sec)) related to Cu$_2$O was calculated by inputting the following value to the equation K=M/(z·F·ρ).

M (molecular weight)=143.09 (g/mol)
z (number of charges)=1 (Cu$_2$O+H$_2$O+2e$^-$→2Cu+2OH$^-$)
F (Faraday constant)=96494 (C/mol) =96500 (A·sec/mol)
ρ (density)=6.04 (g/cm$^3$)

<Observation of Roughened Surface (Fine Irregularities)>

Observation of fine irregularities of the roughened surface (deposited surface) of the roughened copper foil by SEM of the cross-sectional surface revealed that the roughened surface in any of Examples 1 to 5 was composed of fine irregularities composed of numerous acicular crystals. In addition, the cross sectional surface of fine irregularities (in particular acicular crystals) was observed with a transmission electron microscope (TEM) (JEM-ARM 200 F manufactured by JEOL Ltd.) and the height of the acicular crystals (the length in the direction perpendicular to the foil) was measured from the resulting STEM-HAADF image. The height of the acicular crystals in each sample was determined from the average value of 10 points measured within a 1 µm×1 µm area. The results are shown in Table 1.

<Normal Peel Strength to Thermoplastic Resin (PTFE)>

A PTFE substrate (R03003 Bondply, manufactured by ROGERS Corporation, thickness: 125 µm) was provided as a thermoplastic resin substrate. The roughened copper foil immediately after the above-described SERA (thickness: 18 µm) was laminated on the PTFE substrate such that the roughened surface was in contact with the substrate, and the resultant was pressed with a vacuum press machine under the conditions of a pressure of 2.4 MPa, a temperature of 370° C., and a time of 30 min to prepare a copper clad laminate. Next, a test substrate provided with a 0.4-mm wide linear circuit for measuring peel strength was prepared by etching on this copper clad laminate. The resulting linear circuit was peeled off from the PTFE substrate in accordance with Method A (90° peeling) of JIS C 5016-1994, and the normal peel strength (kgf/cm) was measured. This measurement was carried out with a desktop material testing machine (STA-1150, manufactured by Orientec Corp.). The results are shown in Table 1.

<Heat-Resistant Peel Strength to Thermoplastic Resin (PTFE)>

Heat-resistant peel strength (kgf/cm) to PTFE was measured by the same procedure as described above except that the test substrate provided with a 0.4-mm wide linear circuit for measuring peel strength was placed in an oven and heated at 150° C. for 4 hours and floated on a solder bath at 288° C. for 10 sec. The results are shown in Table 1. The technical meaning of measuring peel strength is as follows. Printed wiring boards composed of thermoplastic resins are sometimes exposed to harsh environments, such as high temperature environments, and even after being exposed to such harsh environments, high adhesion reliability of the copper foil and resin is desired. Actually, PTFE printed circuit boards may be used for aircraft, space, and other fields. From this point of view, a further improvement in heat-resistant peel strength is desired. However, in applications that are not exposed to harsh environments such as high temperature environments, only requirement is high normal peel strength, and thus high heat-resistant peel strength is not required.

<Normal Peel Strength to Thermoplastic Resin (Liquid Crystal Polymer)>

As a thermoplastic resin substrate, a 50 µm thick LCP (liquid crystal polymer) film (CT-Z, manufactured by Kuraray Co., Ltd.) was provided. The roughened copper foil was laminated on the LCP film such that the roughened surface was in contact with the film, and the resultant was pressed with a vacuum press machine under the conditions of a compression pressure of 4 MPa, a temperature of 320° C., and a time of 10 min to prepare a copper clad laminate. Then, a test substrate provided with a 0.4-mm wide linear circuit for measuring peel strength was prepared by etching on this copper clad laminate. The linear circuit thus formed was peeled off from the insulating resin substrate in accordance with Method A (90° peeling) of JIS C 5016-1994, and the normal peel strength (kgf/cm) was measured. The results are shown in Table 1.

<Peel Strength to Thermosetting Resin (R1551)>

For an insulating resin substrate, prepreg (R-1551, manufactured by Panasonic Corporation, thickness: 200 µm) was provided. The roughened copper foil was laminated on the prepreg such that the roughened surface was in contact with the prepreg, and the resultant was pressed with a vacuum press machine under the conditions of a compression pressure of 2.9 MPa, a temperature of 190° C., and a time of 90 min to prepare a copper clad laminate. Then, a test substrate provided with a 0.4-mm wide linear circuit for measuring peel strength was prepared by etching on this copper clad laminate. The linear circuit thus formed was peeled off from the insulating resin substrate in accordance with JIS C6481-1996, and the normal peel strength (kgf/cm) was measured. The results are shown in Table 1.

TABLE 2

| | Roughened surface | | | | Normal peel strength to resin | | | |
| | | | | | Thermoplastic resin | | | Thermosetting resin |
| | Thicknesses of CuO and Cu$_2$O determined by SERA | | | Height of acicular | PTFE Normal peel | PTFE Heat-resistant | LCP Normal peel | R1551 Normal peel |
| | CuO (nm) | Cu$_2$O (nm) | Total (nm) | crystal (nm) | strength (kgf/cm) | peel strength (kgf/cm) | strength (kgf/cm) | strength (kgf/cm) |
| Ex. 1 | 2 | 25 | 27 | 130 | 1.28 | 0.90 | 0.98 | 0.75 |
| Ex. 2 | 9 | 35 | 44 | 130 | 1.02 | 0.45 | 0.85 | 0.73 |
| Ex. 3 | 17 | 63 | 80 | 150 | 0.87 | 0.39 | 0.79 | 0.78 |
| Ex. 4 | 19 | 70 | 89 | 180 | 0.70 | 0.38 | 0.71 | 0.77 |
| Ex. 5* | 21 | 77 | 98 | 210 | 0.60 | 0.33 | 0.51 | 0.79 |

TABLE 2-continued

|  | Roughened surface | | | Height of acicular crystal (nm) | Normal peel strength to resin | | | |
|---|---|---|---|---|---|---|---|---|
|  | Thicknesses of CuO and Cu$_2$O determined by SERA | | | | Thermoplastic resin | | | Thermosetting resin |
|  | CuO (nm) | Cu$_2$O (nm) | Total (nm) | | PTFE Normal peel strength (kgf/cm) | PTFE Heat-resistant peel strength (kgf/cm) | LCP Normal peel strength (kgf/cm) | R1551 Normal peel strength (kgf/cm) |
| Ex. 6 | 8 | 44 | 52 | 130 | 1.07 | 0.85 | 0.97 | 0.78 |
| Ex. 7 | 12 | 69 | 81 | 320 | 1.09 | 0.85 | 0.98 | 0.82 |
| Ex. 8 | 8 | 51 | 59 | 130 | 1.08 | 0.96 | 0.97 | 0.78 |

*indicates a comparative example.

The results shown in Table 2 demonstrate that the use of roughened copper foils having a roughened surface having a CuO thickness of 1 to 20 nm and a Cu$_2$O thickness of 15 to 70 nm determined by SERA can achieve a high normal peel strength of 0.70 kgf/cm or more in adhesion to the thermoplastic resins. In contrast, in the case of the thermosetting resin, no improvement in the normal peel strength as seen in the thermoplastic resin was observed at all even when the thicknesses of CuO and Cu$_2$O were within the above ranges. Accordingly, the above remarkable effect achieved in the thermoplastic resins cannot be expected from the results of the thermosetting resin. Normally, the roughened surface has fine irregularities due to the presence of CuO and Cu$_2$O on which OH groups are likely to be present, leading to the hydrophilic surface, resulting in decreased adhesion to the thermoplastic resin. According to the roughened copper foil of the present invention, however, presumably the hydrophilicity of the roughened surface can be desirably reduced by controlling the thicknesses of the CuO and the Cu$_2$O, thereby improving the adhesion to the thermoplastic resin.

The invention claimed is:

1. A method of producing a copper clad laminate, comprising:
    providing a roughened copper foil having at least one roughened surface having irregularities composed of acicular crystals containing cupric oxide and cuprous oxide, and
    bonding a sheet-shaped thermoplastic resin to the roughened surface of the roughened copper foil to provide a copper clad laminate,
    wherein the roughened surface has a cupric oxide thickness of 1 to 20 nm and a cuprous oxide thickness of 15 to 70 nm, both determined by sequential electrochemical reduction analysis (SERA) at the time of bonding the thermoplastic resin.

2. The method according to claim 1, wherein the acicular crystals have a height of 50 to 400 nm.

3. The method according to claim 1, wherein the thermoplastic resin is at least one resin selected from the group consisting of polysulfones, polyethersulfones, amorphous polyarylates, liquid crystal polymers, polyether ether ketones, thermoplastic polyimides, polyamide-imides, fluororesins, polyamides, nylons, polyacetals, modified polyphenylene ethers, polyethylene terephthalate, glass fiber reinforced polyethylene terephthalate, and cycloolefins.

4. The method according to claim 1, wherein the thermoplastic resin is at least one resin selected from the group consisting of polysulfones, polyethersulfones, amorphous polyarylates, liquid crystal polymers, polyether ether ketones, thermoplastic polyimides, polyamide-imides, and fluororesins.

5. The method according to claim 1, wherein the thermoplastic resin is a fluororesin, and the fluororesin is at least one selected from the group consisting of polytetrafluoroethylene, tetrafluoroethylene-perfluoroalkylvinylether copolymers, tetrafluoroethylene-hexafluoropropylene copolymers, and tetrafluoroethylene-ethylene copolymers.

6. The method according to claim 1, wherein the roughened copper foil has an organic rust-proof layer on the roughened surface.

7. The method according to claim 6, wherein the organic rust-proof layer contains at least one of a triazole compound and a silane coupling agent.

8. The method according to claim 6, wherein the organic rust-proof layer comprises a triazole compound.

* * * * *